(12) United States Patent
Shimomura et al.

(10) Patent No.: US 7,260,135 B2
(45) Date of Patent: Aug. 21, 2007

(54) LIGHT EMITTING DEVICE

(75) Inventors: Akihisa Shimomura, Atsugi (JP);
Ryoji Nomura, Yamato (JP); Yasuyuki Arai, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 293 days.

(21) Appl. No.: 10/947,133

(22) Filed: Sep. 23, 2004

(65) Prior Publication Data

US 2005/0069012 A1  Mar. 31, 2005

(30) Foreign Application Priority Data

Sep. 26, 2003  (JP) .............. 2003-335747

(51) Int. Cl.
*H01S 3/097* (2006.01)
(52) U.S. Cl. .......................... 372/87; 372/88
(58) Field of Classification Search ............ 372/87
See application file for complete search history.

(56) References Cited

U.S. PATENT DOCUMENTS

| 6,091,195 | A | 7/2000 | Forrest et al. |
| 6,631,147 | B2 | 10/2003 | Taniguchi et al. |
| 2002/0063515 | A1 | 5/2002 | Goto |
| 2003/0058210 | A1 | 3/2003 | Yamazaki et al. |
| 2003/0103537 | A1 | 6/2003 | Taniguchi et al. |
| 2004/0000673 | A1* | 1/2004 | Murakami ............... 257/88 |

FOREIGN PATENT DOCUMENTS

| JP | 11-045453 | 2/1999 |
| JP | 2000-156536 | 6/2000 |
| JP | 2002-208491 | 7/2002 |
| JP | 2003-017273 | 1/2003 |

OTHER PUBLICATIONS

Nir Tessler, "Lasers Based on Semiconducting Organic Materials," Advanced Materials, 1999, vol. 11, No. 5, pp. 363-370.

* cited by examiner

*Primary Examiner*—Dung T. Nguyen
(74) *Attorney, Agent, or Firm*—Eric J. Robinson; Robinson Intellectual Property Law Office, P.C.

(57) ABSTRACT

The present invention provides a light emitting device typified by a laser oscillator using an electroluminescent material that can enhance directivity of emitted laser light and resistance to a physical impact. A light emitting device includes a first electrode having a convex portion or a concave portion, an electroluminescent layer formed over the first electrode to overlap the convex portion or the concave portion, and a second electrode having a convex portion or a concave portion formed over the electroluminescent layer to overlap the convex portion or the concave portion. In the light emitting device, the first electrode has a curved surface in the convex portion or the concave portion, a center of a curvature of the curved surface is located on an opposite side of the second electrode, and laser light is emitted by oscillating light generated in the electroluminescent layer between the first electrode and the second electrode.

54 Claims, 13 Drawing Sheets

LIGHT EMITTING DEVICE

BACKGROUND OF THE INVENTION

1. Field of the Invention

The present invention relates to a light emitting device using an electroluminescent material that can emit laser light.

2. Description of the Related Art

A semiconductor laser has a merit that a laser oscillator can be miniaturized and reduced in weight drastically, as compared with a gas or solid-state laser. Thus, a semiconductor laser comes into practical use in various fields, as a light-source for receiving and transmitting a signal by an optical interconnection in an optical integrated circuit, a light-source for recording in a recording medium such as an optical disk or an optical memory, and a light-source for optical communications using fiber-optics or the like as a optical wave guide. The oscillation wavelength of a semiconductor laser has a wide range of from the blue wavelength to the infrared wavelength. Many semiconductor lasers that are used generally have their oscillation wavelengths in an infrared region, for example, the wavelength of a GaAs laser is 0.84 μm, the wavelength of an InAs laser is 3.11 μm, the wavelength of an InSb laser is 5.2 μm, the wavelength of a GaAlAs laser is 0.72 to 0.9 μm, and the wavelength of an InGaAsP laser is 1.0 to 1.7 μm.

In recent years, many researches on a practical use of a semiconductor laser having the oscillation wavelength in a visible region have been made. Depending on the trend, a laser oscillator that can emit laser light by using an electroluminescent material that can produce electroluminescence by being applied with an electric field (an organic semiconductor laser) has been attracting more attentions. An organic semiconductor laser is expected to have a variety of use, since the organic semiconductor laser can emit laser light whose wavelength is in a visible region and it can be formed over an inexpensive glass substrate.

Reference 1 describes an organic semiconductor laser of which peak wavelength λ is 510 nm (Reference 1: Japanese Patent Laid Open No. 2000-156536. p. 11).

Laser light emitted from an organic semiconductor laser is generally lower in the directivity and easier to diffuse than laser light emitted from other lasers. When the directivity of laser light is low, receiving and transmitting a signal in an optical interconnection becomes unstable due to disclination, and thus, high integration of an optical integrated circuit is prevented, which is not preferable. When diffusion of laser light is large, it is difficult to assure the energy density of the laser light. A desired energy density can be assured by enhancing the intensity of laser light emitted from a light-source or by shortening the distance between the light-source of the laser light and a predetermined region. However, the former has a demerit of increasing power consumption and the latter has a demerit of limiting the use application of the organic semiconductor laser.

The directivity of laser light can be enhanced by providing an optical system prepared separately for an organic semiconductor laser that serves as a light-source is However, as the optical system is more complicated, an adjustment of the optical system in maintenance or positioning of the optical system and the organic semiconductor laser is more troublesome. Further, there is also a defect that resistance to a physical impact gets worse.

SUMMARY OF THE INVENTION

In view of the above mentioned problems, it is an object of the present invention to provide a light emitting device typified by a laser oscillator using an electroluminescent material that can enhance directivity of emitted laser light and resistance to a physical impact.

A light emitting device of the present invention can emit more laser light having a single mode and with high directivity by providing one or both of reflectors to reflect stimulated emission light with curvature and making two reflectors face each other to form an unstable resonator. A center of curvature of the reflector may be disposed on the other reflector side, or may be disposed on the opposite side thereof.

Specifically, a light emitting device of the present invention includes a first reflector having a convex portion or a concave portion, a light emitting element formed over the first reflector to overlap the convex portion or the concave portion, and a second reflector overlapping the first reflector with the light emitting element therebetween. The light emitting element includes a first electrode (an anode), a second electrode (a cathode) and a light emitting layer provided between the two electrodes, and an electroluminescent material included in the light emitting layer functions as a laser medium according to the present invention. Note that a hole injecting layer, a hole transporting layer or the like between the light emitting layer and the anode, and an electron injecting layer, an electron transporting layer or the like between the light emitting layer and the cathode, may be provided, respectively. In this case, all layers that are provided between the anode and the cathode are referred to as an electroluminescent layer, in which a light emitting layer is also included therein. In some cases, an inorganic compound is included in a layer for forming the electroluminescent layer.

According to the present invention, two reflectors may be provided separately besides the light emitting element as described above. Alternatively, one or both of electrodes of the light emitting element may be used as a reflector. Alternatively, light generated in the light emitting layer may be reflected from a layer other than the light emitting layer, for example, a hole injecting layer, a hole transporting layer, an electron injecting layer, an electron transporting layer or the like, which is included in the electroluminescent layer and is used as a reflector, to form an optical resonator. Light emitted from an electroluminescence material is oscillated by two reflectors to emit laser light.

Further, the optical resonator of a light emitting device of the present invention is an unstable resonator, and a radius of curvature r and a length of a resonator L are adjusted or location of the center of curvature of the concave and convex portions of the reflector is controlled to form an unstable resonator, thereby enhancing the directivity. Moreover, if the unstable resonator has high gain, since it can enlarge a Mode Volume (product of a area which is obtained by a diameter of spot on a reflector surface and a resonator length), a laser output becomes high.

Note that it is difficult in manufacturing steps to form a curved surface in an electrode functioning as a reflector or form an active region that is a laser medium on a reflector with a curved surface in a semiconductor laser using a single crystal semiconductor, unlike an organic semiconductor laser. When a reflector with a curved surface, which is provided separately, is attached after forming the active region that is a laser medium, it is necessary to control locations of two reflectors and the active region in several tens nm order, thereby making manufacturing steps troublesome. However, in the case of an organic semiconductor laser, it is easier to form a curved surface in an electrode functioning as a reflector or to form a light emitting element on a reflector with a curved surface than a semiconductor laser. Therefore, it is comparatively easy to control locations of two reflectors and the active region in several tens nm order by film thickness of each layer.

According to the present invention having the structures, emission efficiency of laser light with a single mode can be enhanced and directivity of laser light can be increased without providing an optical system separately. Further, troublesome steps such as an adjustment of an optical system in maintenance or positioning of the optical system and an organic semiconductor laser can be prevented and the resistance to a physical impact, of a light emitting device can be enhanced, which is different from the case of providing an optical system separately.

These and other objects, features and advantages of the present invention become more apparent upon reading of the following detailed description along with the accompanying drawings.

DETAILED DESCRIPTION OF THE INVENTION

Herein, embodiment mode and embodiments of the present invention are described with reference to the accompanying drawings. Note that the present invention can be carried out in many different modes. It is to be understood that various changes and modifications will be apparent to those skilled in the art, unless such changes and modifications depart from the scope of the present invention hereinafter defined. Therefore, the present invention should not be limited to the content disclosed herein.

[Embodiment Mode]

Figure 1A:
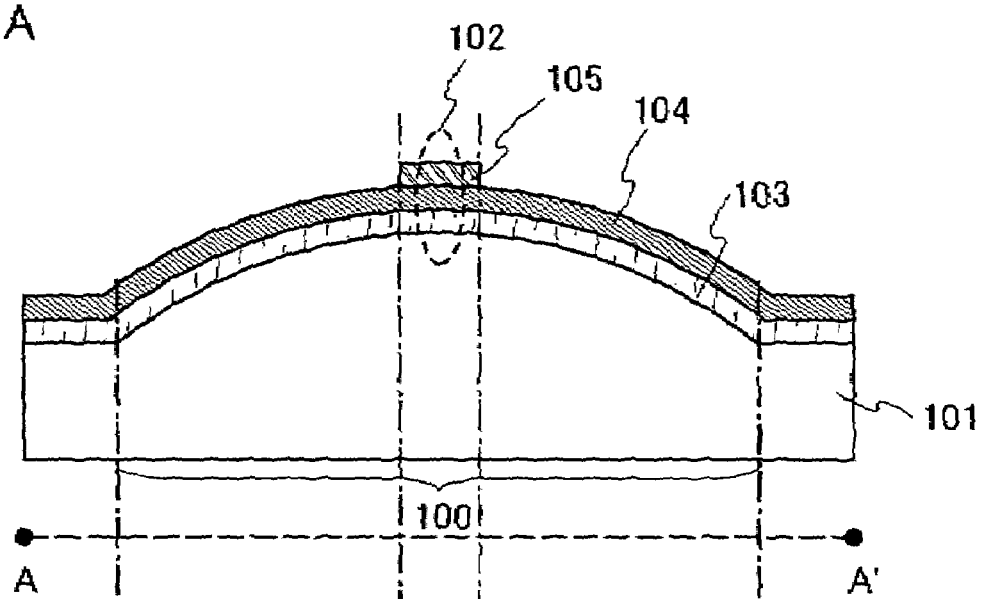
FIGS. 1A and 1B are a cross-sectional view and a top view of a laser oscillator, respectively according to one aspect of the present invention.
Figure 1B:
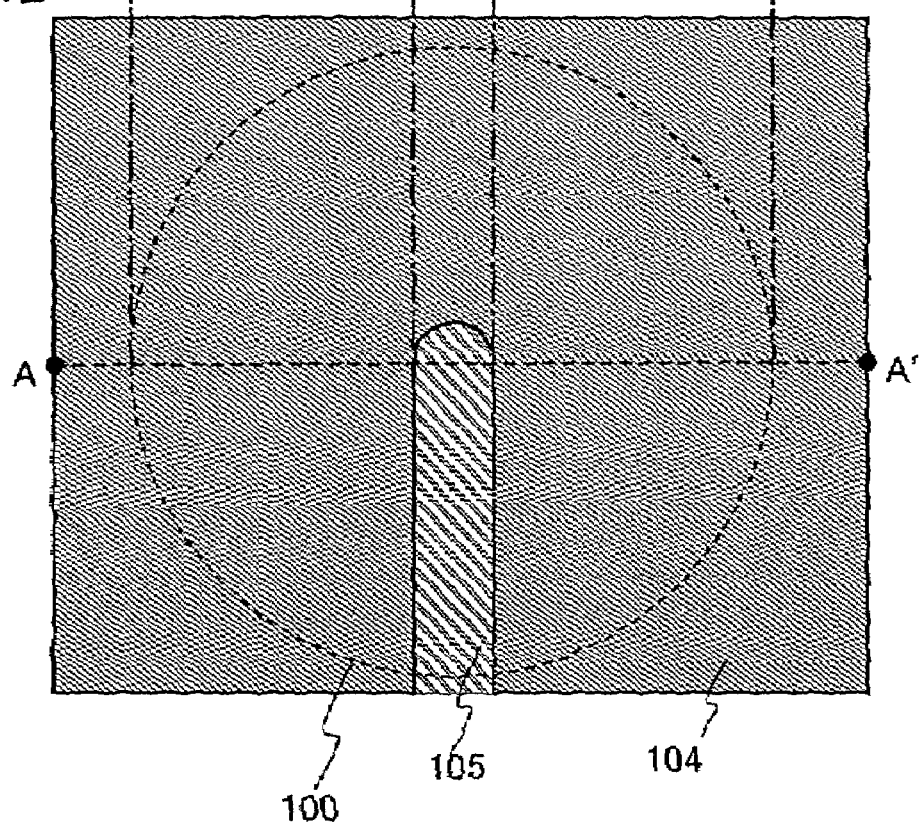

One mode of a laser oscillator of the present invention is explained with reference to FIGS. 1A and 1B. FIG. 1A is a cross-sectional view of the laser oscillator of the present invention. FIG. 1B is a top view of the laser oscillator of the present invention shown in FIG. 1A. FIG. 1A is a cross-sectional view taken along the line A–A' of FIG. 1B. As shown in FIGS. 1A and 1B, the laser oscillator of the present invention includes a substrate 101 having a convex portion 100, and a light emitting element 102 formed over the substrate 101 to overlap the convex portion 100. The convex portion 100 has a curved surface, and the center of curvature of the curved surface is located on the side opposite to the light emitting element 102 of the substrate 101. In addition, when a reflector is a concave to an inside of a resonator, curvature R defines as positive. On the contrary, when a reflector is a convex to an inside of a resonator, curvature R defines as negative. Moreover, following point should be cautious. The words "stable" and "unstable" which are said here does not mean that output from laser is stable or unstable.

FIG. 1A shows an example that the light emitting element 102 is formed directly on the substrate 101, but the present invention is not limited thereto. One or plural films of an insulating film, a film for reflecting light (a reflective film) or the like may be formed between the substrate 101 and the light emitting element 102. In addition, the substrate 101 having the convex portion 100 is used in FIG. 1A, but a convex portion may be formed on a flat substrate by using a film which is different from the substrate.

Figure 10:
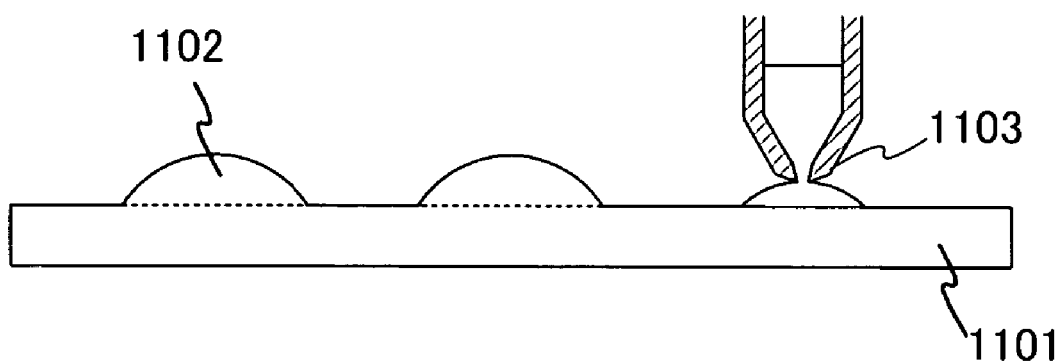
FIG. 10 shows an embodiment for a method for manufacturing a convex portion.

FIG. 10 shows an example that a convex portion 1102 is formed on a flat substrate 1101 by using a droplet discharging method. Reference numeral 1103 denotes a nozzle of the droplet discharging device. For example, the convex portion 100 in FIGS. 1A and 1B may be formed by a droplet discharging method as shown in FIG. 10.

A glass, a quartz, a metal, a bulk semiconductor, a plastic and the like can be used for the substrate 101.

The light emitting element 102 includes an electrode 103 formed on the substrate 101, an electroluminescent layer 104 formed on the electrode 103 and an electrode 105 formed on the electroluminescent layer 104 to overlap the electrode 103. As for the electrode 103 formed on the substrate 101, a curved surface due to the convex portion 100 of the substrate 101 is formed in a surface of the electrode 103 and the center of curvature of the curved surface is located on the substrate 101 side.

One of the electrodes 103 and 105 is an anode, and the other is a cathode. FIGS. 1A and 1B show an example that the electrode 103 serves as an anode, and the electrode 105 serves as a cathode. Alternatively, the electrode 103 may serve as a cathode, and the electrode 105 may serve as an anode. Current is supplied to the electroluminescent layer 104 by applying a forward bias voltage to the electrodes 103 and 105, thereby making the electroluminescent layer 104 emit light.

In the laser oscillator shown in FIGS. 1A and 1B, an optical resonator is formed by using the electrodes 103 and 105 included in the light emitting element 102 as reflectors. Light generated in the electroluminescent layer 104 is oscillated by the electrodes 103 and 105, and is emitted as laser light from the electrode 105 side.

Figure 2:
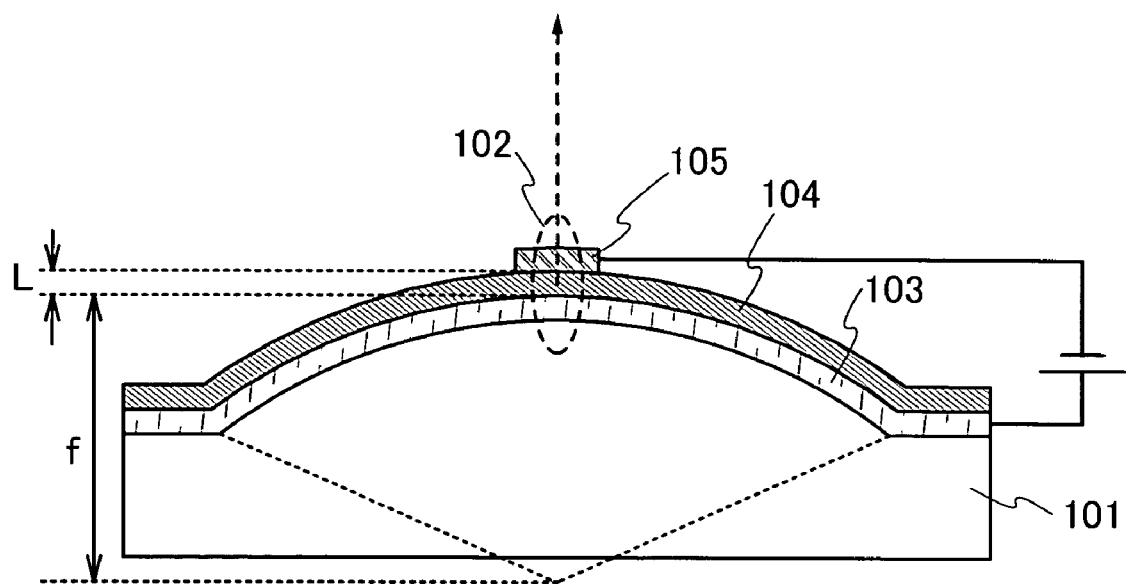
FIG. 2 is a cross-sectional view of a laser oscillator according to one aspect of the present invention.

FIG. 2 shows the laser oscillator shown in FIGS. 1A and 1B, in which a forward bias voltage is applied to the electrodes 103 and 105. Light generated in the electroluminescent layer 104 is oscillated by applying voltage to the electrodes 103 and 105. When the electrode 105 is supposed to have a flat surface, this optical resonator is an unstable resonator. The distance L between the electrodes 103 and 105 that corresponds to a length of an optical resonator and the focus length f (f<0) of the curved surface of the electrode 103 fulfills |f|<L/2. Note that twice focus length f is equivalent to a radius of curvature r, and thus, it can be also said that r<L is fulfilled. The length of an optical resonator is equivalent to the distance between two reflectors on an extension of an optical path of emitted laser light. According to the foregoing structures, a single mode laser light can be easily obtained among laser light emitted from the electrode 105 side and emission efficiency of a single mode laser light can be enhanced. As shown by the arrows of dotted lines, laser light is emitted toward the side opposite of the substrate 101 from the electrode 105 side by applying voltage to the electrodes 103 and 105. Moreover, laser light may be emitted toward the side of the substrate 101 from the electrode 105 side.

When the electrode 105 has a curved surface and the center of curvature of the curved surface is located on the electrode 103 side, it is necessary that at least one of two expressions shown by Expression 1 is to be fulfilled by the length of an resonator L, a radius of curvature $r_1$ ($r_1$<0) of the electrode 103 and a radius of curvature $r_2$ ($r_2$>0) of the electrode 105. In addition, an unstable resonator is determined by choosing the curvature radius of the reflector used for an optical resonator, the location of the center of curvature, and the length of the resonator. Following nine cases may be considered in the relation between the curvature radius and the length of the resonator that is solved by the Expression 1. That is, $r_1$<0 and $r_2$<0 (both of the reflectors having a convex portion, i.e. both of the curvature radius $r_1$ and $r_2$ are negative.); $r_1$<0 and 0<$r_2$<L (one of the reflectors having a convex portion, i.e. the curvature radius $r_1$ is negative, and the other reflector having a concave portion, and the curvature radius $r_2$ is shorter than the length of the resonator L and positive.); $r_1$<0 and $r_2$>L+|$r_1$| (one of the reflectors having a convex portion, i.e. the curvature radius $r_1$ is negative, and the other reflector having a concave portion, and the curvature radius $r_2$ is larger than addition of the length of the resonator L to absolute value of the curvature radius $r_1$.); 0<$r_1$<L and $r_2$<0 (one of the reflectors having a concave portion, the curvature radius $r_1$ is shorter than the length of the resonator L and positive, and the other reflector having a convex portion, i.e. the curvature radius $r_2$ is negative.); $r_1$>L+|$r_2$| and $r_2$<0 (one of the reflectors having concave portion, the curvature radius $r_1$ is larger than addition of the length of the resonator L to absolute value of the curvature radius $r_2$, and the other reflector having a convex portion, i.e. the curvature radius $r_2$ is negative.); 0<$r_1$<L and $r_2$>L (both of the reflectors are having concave portions, the curvature radius $r_1$ is shorter than the length of the resonator L and positive, and the curvature radius $r_2$ is larger than the length of the resonator L.); 0<$r_1$<L−$r_2$ and 0<$r_2$<L/2 (both of the reflectors having concave portions, the curvature radius $r_1$ is shorter than subtraction of the curvature radius $r_2$ from the length of the resonator L, and the curvature radius $r_2$ is shorter than a half of the length of the resonator L and positive.); $r_1$>L and 0<$r_2$<L (both of the reflectors having concave portions, the curvature radius $r_1$ is larger than the length of the resonator L, and the curvature radius $r_2$ is shorter than the length of the resonator L and positive.); 0<$r_1$<L/2 and 0<$r_2$<L−$r_1$ (both of the reflectors having concave portions, the curvature radius $r_1$ is shorter than a half of the length of the resonator L and positive, and the curvature radius $r_2$ is shorter than subtraction of the curvature radius $r_1$ from the length of the resonator L and positive.)

$$\{1-(L/r_1)\} \times \{1-(L/r_2)\} < 0 \qquad \text{[Expression 1]}$$
$$1 < \{1-(L/r_1)\} \times \{1-(L/r_2)\}$$

FIGS. 1A, 1B and 2 each show a mode of enhancing emission efficiency of a single mode laser light by using a reflector having a convex portion. However, a reflector having a concave portion may be used. A mode of a laser oscillator using a reflector having a concave portion is described with reference to FIG. 3.

Figure 3:
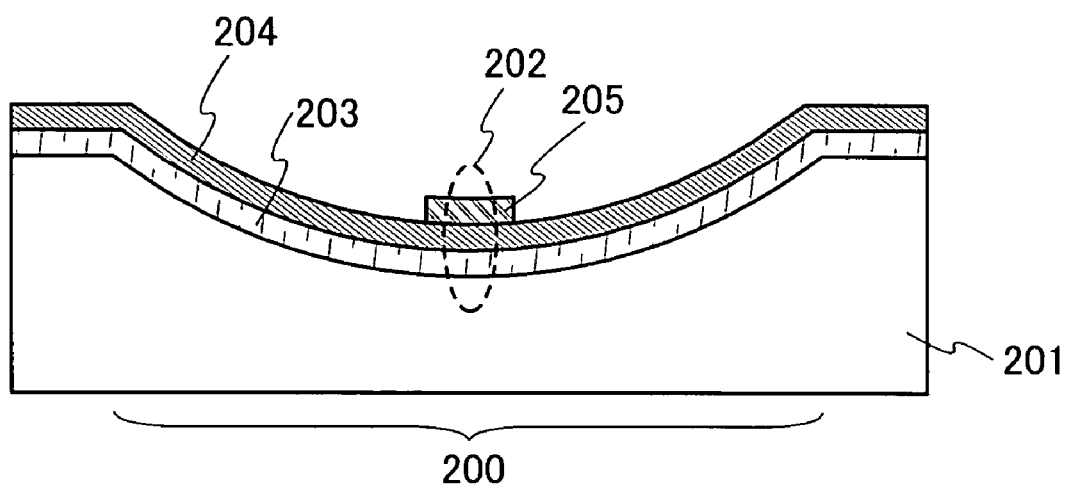
FIG. 3 is a cross-sectional view of a laser oscillator according to one aspect of the present invention.

FIG. 3 is a cross-sectional view of the laser oscillator of the present invention. As shown in FIG. 3, the laser oscillator of the present invention includes a substrate 201 having a concave portion 200, and a light emitting element 202 formed over the substrate 201 to overlap the concave portion 200. A glass, a quartz, a metal, a bulk semiconductor, a plastic and the like can be used for the substrate 201.

FIG. 3 shows an example that the light emitting element 202 is formed directly on the substrate 201, but the present invention is not limited thereto. One or plural films of an insulating film, a film for reflecting light (a reflective film) or the like may be formed between the substrate 201 and the light emitting element 202. In addition, the substrate 201 having the concave portion 200 is used in FIG. 3, but a concave portion may be formed on a flat substrate by using a film which is different from the substrate.

The concave portion 200 has a curved surface and the center of curvature of the curved surface is located on the light emitting element 202 side.

The light emitting element 202 includes an electrode 203 formed on the substrate 201, an electroluminescent layer 204 formed on the electrode 203 and an electrode 205 formed on electroluminescent layer 204 to overlap the electrode 203. One of the electrodes 203 and 205 is an anode, and the other is a cathode. FIG. 3 shows an example that the electrode 203 serves as an anode, and the electrode 205 serves as a cathode. Alternatively, the electrode 203 may serve as a cathode, and the electrode 205 may serve as an anode. Current is supplied to the electroluminescent layer 204 by applying a forward bias voltage to the electrodes 203 and 205, thereby making the electroluminescent layer 204 emit light.

In the laser oscillator shown in FIG. 3, an optical resonator is formed from the electrodes 203 and 205 included in the light emitting element 202, as in the laser oscillator shown in FIGS. 1A and 1B. Light generated in the electroluminescent layer 204 is oscillated by the electrodes 203 and 205 and is emitted as laser light from the electrode 205 side. Moreover, laser light may be emitted toward the side of the substrate 201 from the electrode 205 side.

The optical resonator formed from the electrodes 203 and 205 is an unstable resonator. It is necessary that the distance L between the electrodes 203 and 205 that corresponds to the length of a resonator and the focus length f (f<0) of the curved surface of the electrode 203 fulfills |f|<L/2, for the sake of forming the unstable resonator in FIG. 3.

When the electrode 205 has a curved surface and the center of curvature of the curved surface is located on the electrode 203 side, it is necessary that at least one expression of two expressions shown by Expression 1 described above is to be fulfilled by the length of an resonator L, a radius of curvature $r_1$ ($r_1<0$) of the electrode 203 and a radius of curvature $r_2$ ($r_2>0$) of the electrode 205. Through the foregoing structures, a single mode laser light can be easily obtained among laser light emitted from the electrode 205 side and emission efficiency of the single mode laser light can be enhanced.

Note that two electrodes of a light emitting element are used as reflectors in FIGS. 1A, 1B, 2, and 3, but the present invention is not limited to the structure. Two reflectors may be provided separately besides a light emitting element. Alternatively, one of electrodes of a light emitting element may be used as a reflector and one reflector may be provided separately. Alternatively, light generated in a light emitting layer may be reflected from a layer other than the light emitting layer, for example, a hole injecting layer, a hole transporting layer, an electron injecting layer, an electron transporting layer or the like, which is included in an electroluminescent layer and is used as a reflector, to form an optical resonator.

[Embodiment 1]

A structure of a light emitting element used for a laser oscillator of the present invention is explained in Embodiment 1.

Figure 5:
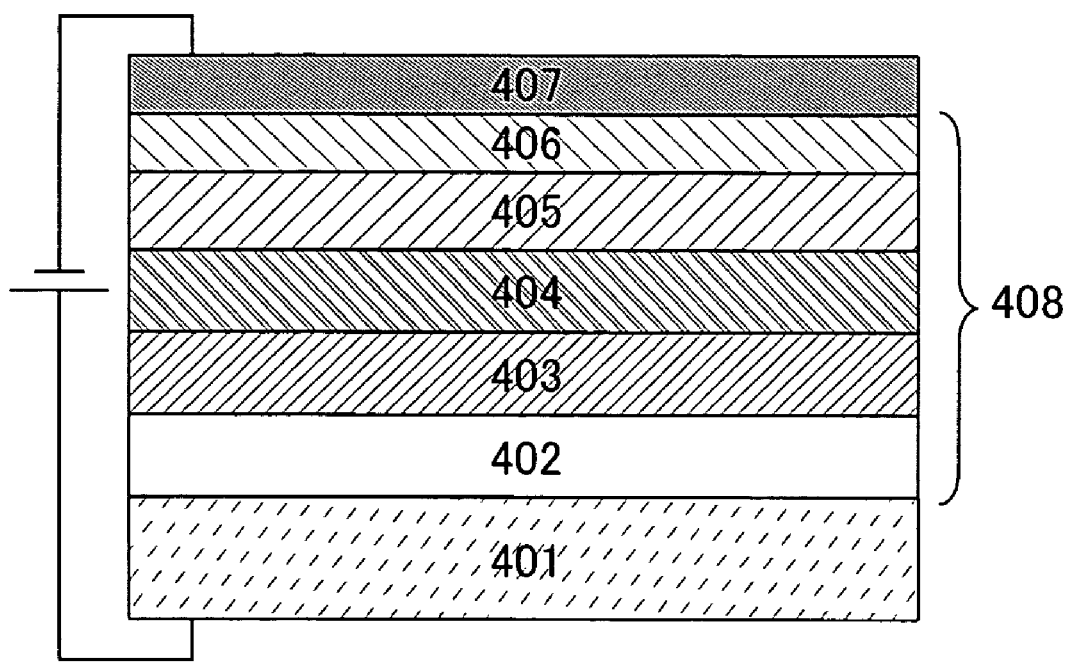
FIG. 5 shows a structure of a light emitting element used for a laser oscillator according to one aspect of the present invention.

FIG. 5 shows one mode of a structure of a light emitting element used in the present invention. A light emitting element shown in FIG. 5 has a structure in which an electroluminescent layer 408 is included between an anode 401 and a cathode 407. The electroluminescent layer 408 is formed by sequentially stacking a hole injecting layer 402, a hole transporting layer 403, a light emitting layer 404, an electron transporting layer 405, and an electron injecting layer 406 over the anode 401.

A light emitting element used for a laser oscillator of the present invention may include at least a light emitting layer within an electroluminescent layer. Layers having properties other than light emission (a hole injecting layer, a hole transporting layer, an electron transporting layer, and an electron injecting layer) can be combined appropriately. Although not limited to the materials recited herein, the above-mentioned layers are each formed by the following materials.

As the anode 401, a conductive material having a large work function is preferably used. In the case that light is passed through the anode 401, a material having favorable light-transmitting properties is used for the anode 401. In this instance, a transparent conductive material such as an indium tin oxide (ITO), an indium zinc oxide (IZO), or an indium tin oxide containing silicon oxide (ITSO) may be used. In the case that the anode 401 is used as the reflector, a material that can reflect light is used for the anode 401. For example, a single layer formed by one or a plurality of elements selected from TiN, ZrN, Ti, W, Ni, Pt, Cr, Ag, and the like; a lamination layer of a titanium nitride film and a film mainly containing aluminum; a lamination of three layers of a titanium nitride film, a film mainly containing aluminum, and a titanium nitride film; or the like can be used. Alternatively, a lamination formed by laminating the transparent conductive material on such a material that can reflect light may be used as the anode 401.

As a hole injecting material for the hole injecting layer 402, a material that has comparative small ionization potential and small visible light absorption properties is preferably used. Such materials can be broadly divided into metal oxides, low molecular organic compounds, and high molecular organic compounds. Metal oxides such as a vanadium oxide, a molybdenum oxide, a ruthenium oxide, and an aluminum oxide can be used. Low molecular organic compounds such as star-burst amine as typified by m-MTDATA, metallophthalocyanine as typified by copper phthalocyanine (Cu-Pc), phthalocyanine ($H_2$—PC), and 2,3-dioxyethylenethiopehen derivatives can be used. The hole injecting layer 402 may be formed by co-evaporation of the low molecular organic compound and the metal oxide. High molecular organic compounds such as polyaniline (PAni), polyvinyl carbazole (PVK), and polythiophene derivatives can be used. Polyethylenedioxythiophene (PEDOT), which is one of polythiophene derivatives, doped with polystyrene sulfonate (PSS) can be used.

As a hole transporting material for the hole transporting layer 403, a known material that has favorable hole transporting properties and low crystallinity can be used. Aromatic amine based compounds (namely, a compound having a benzene ring-nitrogen bond) are preferably used. For example, 4,4-bis[N-(3-methylphenyl)-N-phenylamino]-biphenyl (TPD), and derivatives thereof such as 4,4'-bis[N-(1-naphthyl)-N-phenyl-amino]-biphenyl (α-NPB) etc., are cited. Star burst aromatic amine compounds such as 4,4',4"-tris(N,N-diphenylamino)-triphenyl amine (TDATA), and MTDATA can be also used. Alternatively, 4,4'4"-tris(N-carbazolyl)triphenylamine (TCTA) may be used. As a high molecular material, poly(vinylcarbazole) having favorable hole transporting properties can be used. Further, inorganic substances such as $MoO_x$ may be used.

A known material can be used for the light emitting layer 404. For example, metal complexes such as tris(8-quinolinolate) aluminum ($Alq_3$), tris(4-methyl-8-quinolinolate) aluminum ($Almq_3$), bis(10-hydroxybenzo[η]-quinolinato) beryllium ($BeBq_2$), bis (2-methyl-8-quinolinolato)-(4-hydroxy-biphenylyl)-aluminum (BAlq), bis [2-(2-hydroxyphenyl)-benzooxazolate] zinc ($Zn(BOX)_2$), or bis [2-(2-hydroxyphenyl)-benzothiazolate] zinc ($Zn(BTZ)_2$) can be used. Various fluorescent dyes (coumarin derivatives, quinacridone derivatives, rubrene, 4,4-dicyanomethylene, 1-pyron derivatives, stilbene derivatives, various condensation aromatic compounds, or the like) can be also used. Phosphorescent materials such as platinum octaethylporphyrin complexes, tris(phenylpyridine)iridium complexes, and tris(benzylideneacetonato) phenanthrene europium complexes can be used. Especially, phosphorescent materials have longer excitation time than fluorescent materials, and thus the phosphorescent materials can make easily population inversion that is indispensable to laser oscillation, that is, the state where the number of molecules in an excited state is larger than that in a ground state. The foregoing materials can be used as a dopant or a single layer film.

As a host material for the light emitting layer 404, a hole transporting material or an electron transporting material as typified by the foregoing examples can be used. A bipolar material such as 4,4'-N,N'-dicarbazolyl-biphenyl (CBP) can be also used.

As an electron transporting material for the electron transporting layer 405, metal complexes as typified by $Alq_3$ having a quinoline skeleton or a benzoquinoline skeleton, the mixed ligand complexes or the like can be used. Specifically, metal complexes such as $Alq_3$, $Almq_3$, $BeBq_2$, BAlq, $Zn(BOX)_2$, or $Zn(BTZ)_2$ can be cited. Alternatively, oxadiazole derivatives such as 2-(4-biphenylyl)-5-(4-tert-butylphenyl)-1,3,4-oxadiazole (PBD), or 1,3-bis[5-(p-tertbutylphenyl)-1,3,4-oxadiazole-2-yl]benzene (OXD-7); triazole derivatives such as 3-(4-tert-butylphenyl)-4-phenyl-5-(4-biphenylyl)-1,2,4-triazole (TAZ), or 3-(4-tert-butylphenyl)-4-(4-ethylphenyl)-5-(4-biphenylyl)-1,2,4-triazole (p-EtTAZ); imidazole derivatives such as TPBI; phenanthroline derivatives such as bathophenanthroline (BPhen); bathocuproin (BCP) can be used in addition to metal complexes.

As an electron injecting material for the electron injecting layer, the foregoing electron transporting material can be used. Besides, an ultra thin film of insulator, for example, alkali metal halides such as LiF or CsF, alkali earth metal halides such as $CaF_2$, alkali metal oxides such as $LiO_2$, is frequently used. Further, alkali metal complexes such as lithium acetylacetonate (Li(acac)) or 8-quinolinolato-lithium (Liq) can be effectively used.

Metals, alloys, or electric conductive compounds that each has a small work function, or a mixture thereof, which are used in a conventional light emitting element, can be used for the cathode 407. Specifically, alkali metals such as Li and Cs; alkali earth metals such as Mg, Ca, and Sr; an alloy including the elements (Mg:Ag, Al:Li, or the like); or rare earth metals such as Yb and Er can be used. In the case of using an electron injecting layer such as LiF, CsF, $CaF_2$, or $Li_2O$, a general conductive thin film such as aluminum can be used. In the case where light is passed through the cathode 407, the cathode 407 may be formed by a lamination of an ultra thin film containing alkali metals such as Li or Cs and alkali earth metals such as Mg, Ca, Sr; and a transparent conductive film (such as ITO, ITSO, IZO, or ZnO). Alternatively, an electron injecting layer is formed by co-evaporation of an alkali metal or an alkali earth metal and an electron transporting material, and a transparent conductive film (such as ITO, ITSO, IZO, or ZnO) may be laminated thereon to form the cathode 407.

An optical resonator is formed by two reflectors, one of which is formed to have reflectivity as high as possible and the other of which is formed to have a certain level of transmittance. Accordingly, laser light can be emitted from the reflector that has high transmittance. For example, in the case where the anode 401 and the cathode 407 are used as reflectors to emit laser light, these electrodes are formed by selecting materials or thickness to have transmittance of approximately from 5 to 70%. Alternatively, in the case where a reflector is formed separately, the reflector is formed by such a material that light is passed through the anode 401 or the cathode 407.

The distance between the two reflectors is an integral multiple of a half of the wavelength λ to be oscillated. A lamination structure of a light emitting element is designed so that a phase of light reflected by a reflector is identical to that of light newly generated.

A method for laminating each layer of the light emitting element of the present invention is not limited. As long as the light emitting element can be formed by laminating layers, any method such as vacuum vapor deposition, spin coating, ink jetting, or dip coating can be utilized.

[Embodiment 2]

One mode of a laser oscillator including a plurality of light emitting elements of the present invention is explained in Embodiment 2.

Figure 6A:
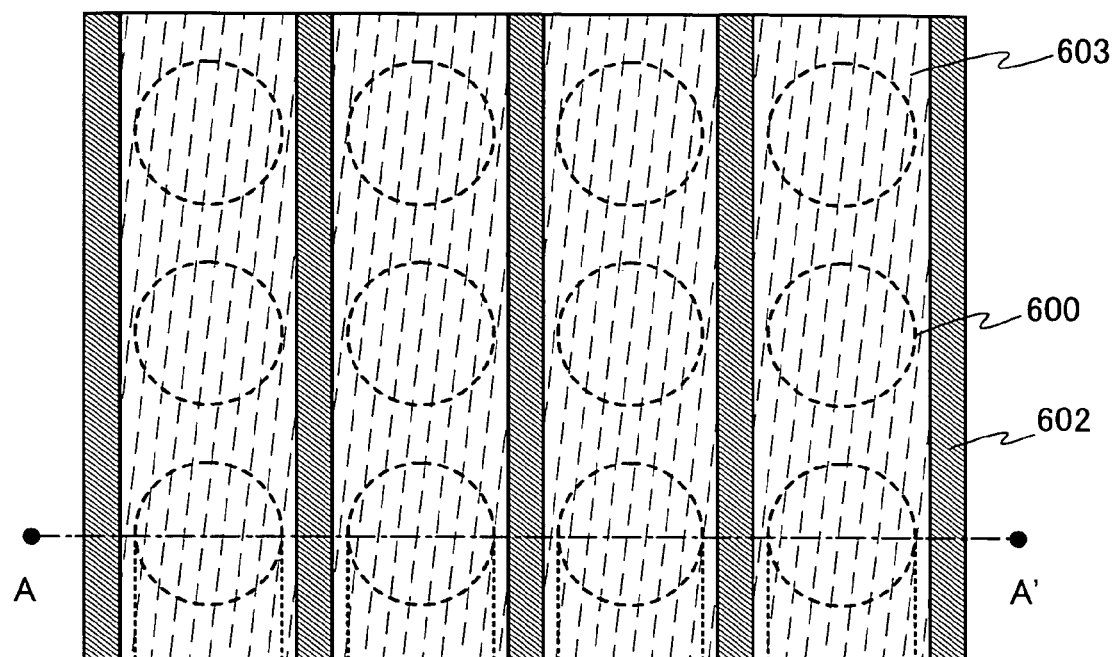
FIGS. 6A and 6B are a top view and a cross-sectional view in a process for manufacturing a laser oscillator, respectively according to one aspect of the present invention.
Figure 6B:
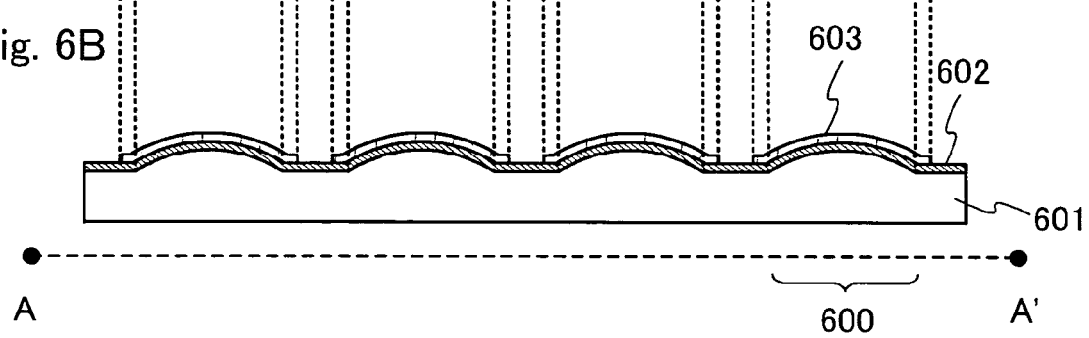

FIG. 6A is a top view of the laser oscillator in this embodiment when an anode of a light emitting element is formed. FIG. 6B is a cross-sectional view taken along the line A–A' of FIG. 6A. In the laser oscillator in this embodiment, a reflective film 602 is formed to overlap plural convex portions 600 on a substrate 601 having the plural convex portions 600. The reflective film 602 can reflect light emitted from a light emitting element and employ an insulating material. For example, insulating films having different refractive indexes, such as a silicon oxide, a silicon nitride, a titanium oxide may be alternately laminated to be used as the reflective film 602.

An anode 603 is formed on the reflective film 602 to overlap the plural convex portions 600. The anode 603 is formed from a light-transmitting material. In FIGS. 6(A) and (B), the anode 603 is light-transmitting, and the reflective film 602 is used as a reflector. However, this embodiment is not limited thereto. The anode 603 may be formed from a light-reflector without providing the reflective film 602.

Figure 7A:
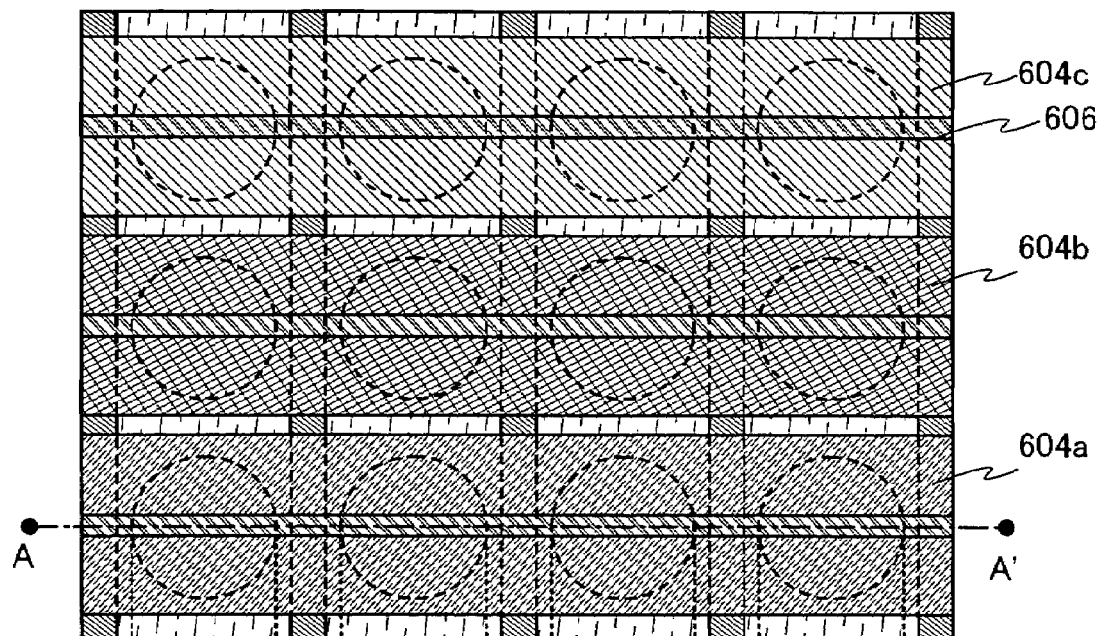
FIGS. 7A and 7B are a top view and a cross-sectional view of a laser oscillator, respectively according to one aspect of the present invention.
Figure 7B:
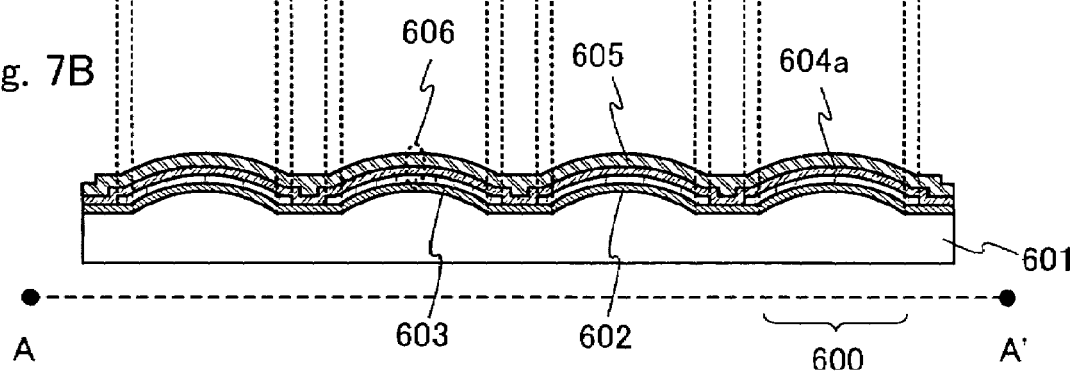

FIG. 7A is a top view of the laser oscillator of Embodiment 2 when a light emitting element is completed. FIG. 7B is a cross-sectional view taken along the line A–A' of FIG. 7A. As shown in FIGS. 7A and 7B, electroluminescent layers 604a to 604c corresponding to three colors of red (R), green (G), and blue (B) are formed over the anode 603 to overlap the plurality of convex portions 600. The electroluminescent layers 604a to 604c are formed separately in FIG. 7A. Alternatively, the electroluminescent layers 604a to 604c may be formed so as to be overlapped partly with one another. Over the electroluminescent layers 604a to 604c, a cathode 605 is formed to overlap the plurality of convex portions 600.

In this embodiment, the arbitrary cathode 605 partly overlaps each anode 603. The overlapping portion serves as a light emitting element 606. The light emitting elements 606 are each located in each of the convex portions 600. The cathode 605 is formed to have transmittance of approximately from 5 to 70% so that light generated in the electroluminescent layers 604a to 604c is oscillated between the reflective film 602 and the cathode 605, each of which serves as a reflector, to be emitted from the cathode 605 side. An optical resonator formed by the reflective film 602 and the cathode 605 is an unstable resonator, thereby enhancing directivity of laser light emitted from the cathode 605 side. The laser oscillator of this embodiment can emit laser light from the selected light emitting element 606 by controlling voltage applied to the anode 603 and the cathode 605, similarly to a passive matrix light emitting device.

In this embodiment, the anode 603 and the cathode 605 may be exchanged. Note that the anode 603 is formed from a material that can reflect light, since it serves as a reflector at this time.

This embodiment shows a mode of enhancing emission efficiency of a single mode laser light by using a reflector having a convex portion. However, a reflector having a concave portion may be used. Although this embodiment shows the mode that the substrate 601 has the concave portion or the convex portion, the concave portion or the convex portion may be formed on a flat substrate by using a film which is different from the substrate. In addition, a laser resonator (a light emitting device) according to this embodiment may be used as a display device. Moreover, the laser oscillator according to this embodiment may be used as an active matrix display device by providing driving elements for each of light emitting elements. The display device equipped with the laser oscillator according to this embodiment includes a projector and the like.

The electroluminescent layers for R, G and B are provided in this embodiment, but in the case of a monochrome display, one electroluminescent layer may be employed.

This embodiment can be freely combined with Embodiment 1.

[Embodiment 3]

One mode of a laser oscillator shown in FIGS. 1A and 1B, in which a reflective film that can reflect light is formed between a substrate and a light emitting element, is explained in Embodiment 3.

Figure 4A:
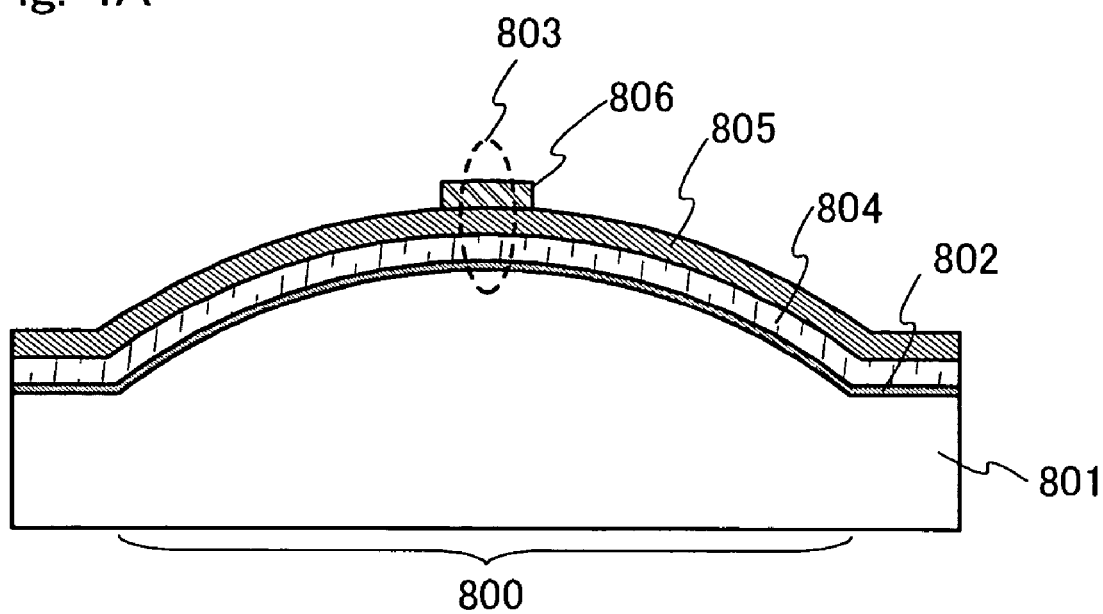
FIGS. 4A and 4B are cross-sectional views of a laser oscillator according to one aspect of the present invention.

FIG. 4A is a cross-sectional view of the laser oscillator of this embodiment. In the laser oscillator of this embodiment as shown in FIG. 4A, a reflective film 802 is formed on a substrate 801 having a convex portion 800 to overlap the convex portion 800. The reflective film 802 can be formed by a material that can reflect light. As the material for the reflective film 802, a material containing one or a plurality of metal elements such as Al, Ag, Ti, W, Pt, or Cr can be used. The reflective film 802 can be formed by a vapor deposition method. A material for the reflective film is not limited to the foregoing materials. Any material can be used as long as it can reflect light. For example, the reflective film may be formed by alternately stacking a plurality of insulating films, each of which has different refractive indexes, such as a silicon oxide film, a silicon nitride film, and a titanium oxide film.

A light emitting element 803 is formed to overlap the convex portion 800 over the reflective film 802. The light emitting element 803 includes an electrode 804 formed over the reflective film 802, an electroluminescent layer 805 formed over the electrode 804 and an electrode 806 formed over the electroluminescent layer 805 to overlap the electrode 804.

The substrate 801 has the convex portion 800 with a curved surface. The center of curvature of the curved surface is located on the opposite side of the light emitting element 803 over the substrate 801.

Figure 4B:
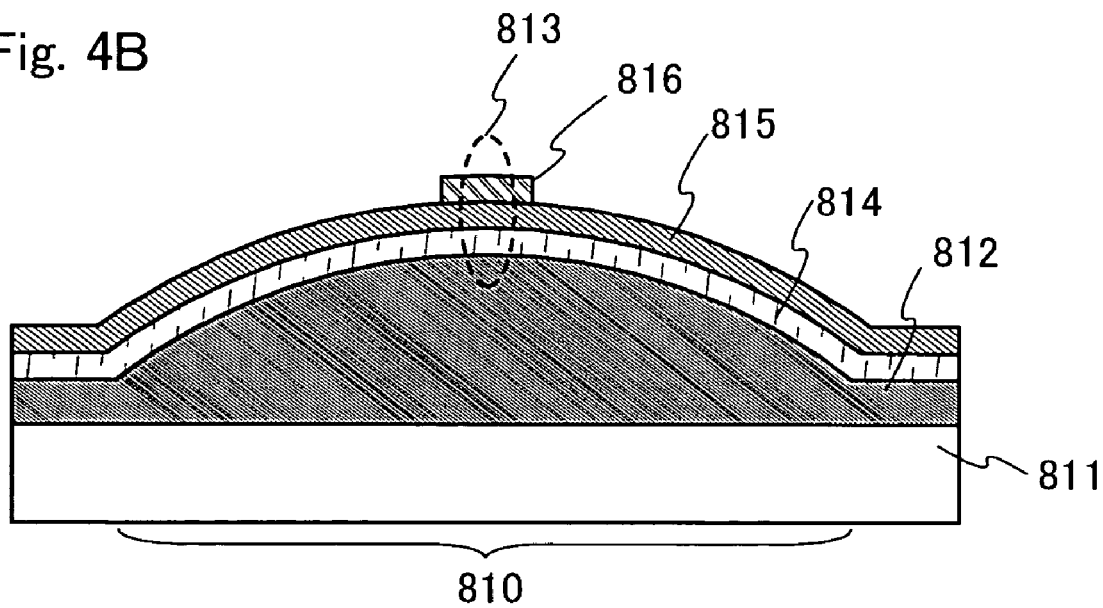

One of the electrodes 804 and 806 is an anode, and the other is a cathode. FIGS. 4A and 4B each show an example that the electrode 804 serves as an anode and the electrode 806 serves as a cathode. Alternatively, the electrode 804 may serve as a cathode and the electrode 806 may serve as an anode. Current is supplied to the electroluminescent layer 805 by applying a forward bias voltage to the electrodes 804 and 806, thereby making the electroluminescent layer 805 emit light. In FIG. 4A, the electrode 804 is light-transmitting and the reflective film 802 and the electrode 806 serve as reflectors. Light emitted from the electroluminescent layer 805 is oscillated by the electrodes 804 and 806 to be emitted as laser light from the electrode 806 side. Moreover, laser light may be emitted toward the side of the substrate 801 from the electrode 805 side.

FIG. 4B is a cross-sectional view of the laser oscillator of this embodiment. In the laser oscillator of this embodiment as shown in FIG. 4B, a reflective film 812 having a convex portion 810 is formed on a flat substrate 811. The reflective film 812 can be formed by a material that can reflect light. As the material for the reflective film 812, a material containing one or a plurality of metal elements such as Al, Ag, Ti, W, Pt, or Cr can be used. A material for the reflective film is not limited to the foregoing materials. Any material can be used as long as it can reflect light.

A light emitting element 813 is formed to overlap the convex portion 810 over the reflective film 812. The light emitting element 813 includes an electrode 814 formed over the reflective film 812, an electroluminescent layer 815 formed over the electrode 814 and an electrode 816 formed over the electroluminescent layer 815 to overlap the electrode 814.

The reflective film 812 has the convex portion 810 with a curved surface. The center of curvature of the curved surface is located on the opposite side of the light emitting element 813 over the reflective film 812.

One of the electrodes 814 and 816 is an anode, and the other is a cathode. FIGS. 4A and 4B each show an example that the electrode 814 serves as an anode and the electrode 816 serves as a cathode. Alternatively, the electrode 814 may serve as a cathode and the electrode 816 may serve as an anode. Current is supplied to the electroluminescent layer 815 by applying a forward bias voltage to the electrodes 814 and 816, thereby making the electroluminescent layer 815 emit light. In FIG. 4B, the electrode 814 is light-transmitting and the reflective film 812 and the electrode 816 serve as reflectors. Light emitted from the electroluminescent layer 815 is oscillated by the electrodes 814 and 816 to be emitted as laser light from the electrode 816 side. Moreover, laser light may be emitted toward the side of the substrate 811 from the electrode 816 side.

This embodiment can be freely combined with Embodiment 1 or 2.

[Embodiment 4]

Figure 8:
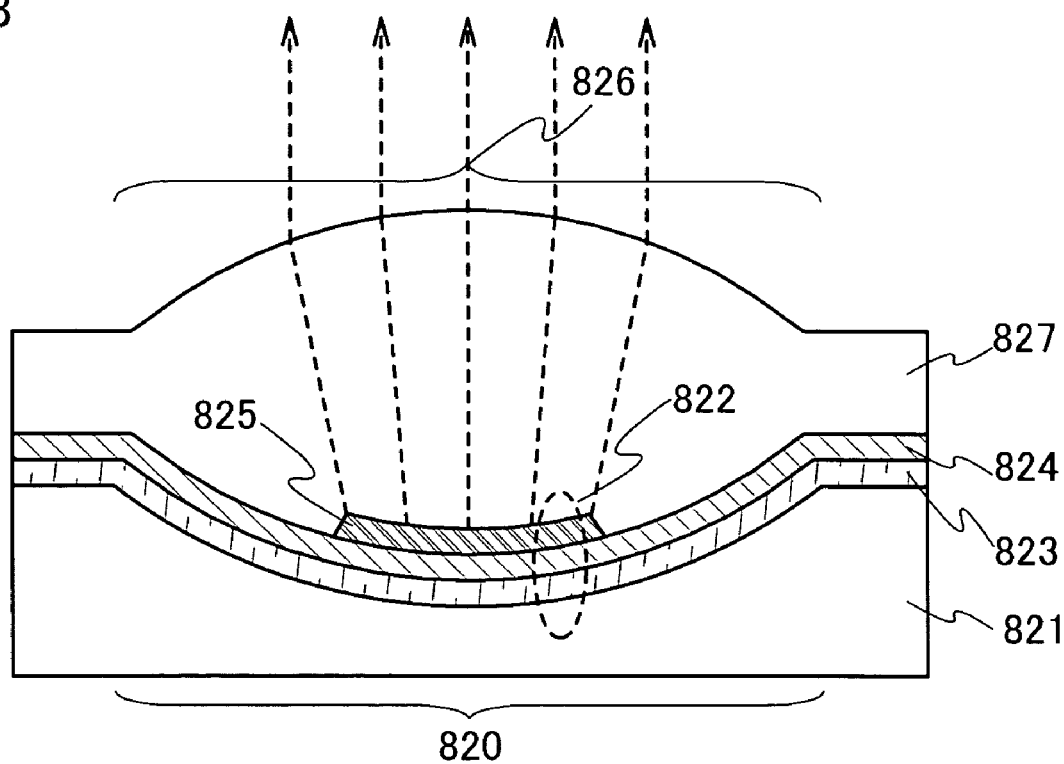
FIG. 8 is a cross-sectional view of a laser oscillator according to one aspect of the present invention.

A mode of forming a film having a convex portion in a laser oscillator shown in FIG. 8 is described in Embodiment 4.

FIG. 8 is a cross-sectional view of the laser oscillator in this embodiment. As shown in FIG. 8, the laser oscillator of this embodiment includes a substrate 821 having a concave portion 820, and a light emitting element 822 formed over the substrate 821 to overlap the concave portion 820. A glass, a quartz, a metal, a bulk semiconductor, a plastic and the like can be used for the substrate 821.

FIG. 8 shows an example that the light emitting element 822 is formed directly on the substrate 821, but the present invention is not limited thereto. One or plural films of an insulating film, a film for reflecting light (a reflective film) or the like may be formed between the substrate 821 and the light emitting element 822. In addition, the substrate 821 having the concave portion 820 is used in FIG. 8, but a concave portion may be formed on a flat substrate by using a film which is different from the substrate.

The concave portion 820 has a curved surface and the center of curvature the curved surface is located on the light emitting element 822 side.

The light emitting element 822 includes an electrode 823 formed on the substrate 821, an electroluminescent layer 824 formed on the electrode 823 and an electrode 825 formed on electroluminescent layer 824 to overlap the electrode 823. One of the electrodes 823 and 825 is an anode, and the other is a cathode. FIG. 8 shows an example that the electrode 823 serves as an anode, and the electrode 825 serves as a cathode. Alternatively, the electrode 823 may serve as a cathode, and the electrode 825 may serve as an anode. Current is supplied to the electroluminescent layer 824 by applying a forward bias voltage to the electrodes 823 and 825, thereby making the electroluminescent layer 824 emit light.

Further, a layer having a convex portion 826 (hereinafter, referred to as a convex portion layer) 827 is formed to cover the light emitting element 822 in FIG. 8. The convex portion 826 is formed to overlap the light emitting element 822. Note that the convex portion layer 827 may be formed from a single layer or plural layers. In any case, the convex portion layer 827 is light-transmitting.

In the laser oscillator shown in FIG. 8, an optical resonator is formed from the electrodes 823 and 825 included in the light emitting element 822, as in the laser oscillator shown in FIG. 3. Light generated in the electroluminescent layer 824 is oscillated by the electrodes 823 and 825, and is emitted as laser light from the electrode 825 side. Moreover, laser light may be emitted toward the side of the substrate 821 rom the electrode 825 side.

Note that an optical resonator formed from the electrodes 823 and 825 is an unstable resonator. Therefore, laser light emitted from the unstable resonator can obtain a single mode more easily and higher in its directivity than one emitted from a stable resonator. In this embodiment, laser light is refracted in the convex portion 826 of the convex portion layer 827, and therefore, divergence angle can be suppressed, thereby enhancing directivity of laser light more. The focus length of the convex portion 826 may be optically designed depending on divergence angle of laser light irradiated on the convex portion 826 to suppress the divergence angle.

Note that two electrodes of a light emitting element are used as reflectors in FIG. 8, but the present invention is not limited to the structure. Two reflectors may be provided separately besides a light emitting element. Alternatively, one of electrodes of a light emitting element may be used as a reflector and another reflector may be provided separately. Alternatively, light generated in a light emitting layer may be reflected from a layer other than the light emitting layer, for example, a hole injecting layer, a hole transporting layer, an electron injecting layer, an electron transporting layer or the like, which is included in an electroluminescent layer and is used as a reflector, to form an optical resonator.

This embodiment can be combined with Embodiment 1, 2 or 3 appropriately.

[Embodiment 5]

A method for forming a convex portion is explained in Embodiment 5.

Figure 9A:
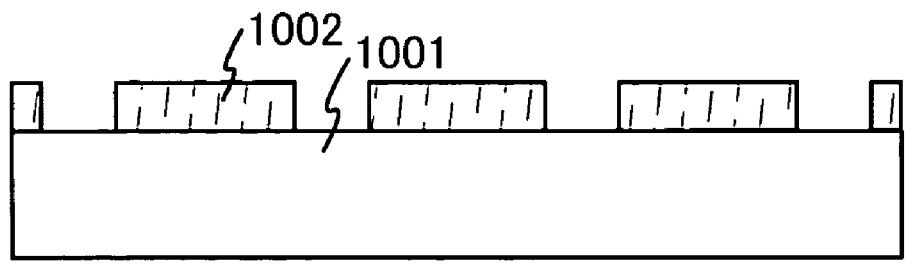
FIGS. 9A to 9E each show an embodiment for a method for manufacturing a convex portion.

As shown in FIG. 9A, resin 1002 is formed, which can be melted by heating, over a substrate 1001 that is afterward provided with a convex portion. The resin 1002 is patterned to have an island-like shape. The substrate 1001 can be made of a glass, a quartz, a metal, a bulk semiconductor, a plastic, or the like.

Figure 9B:
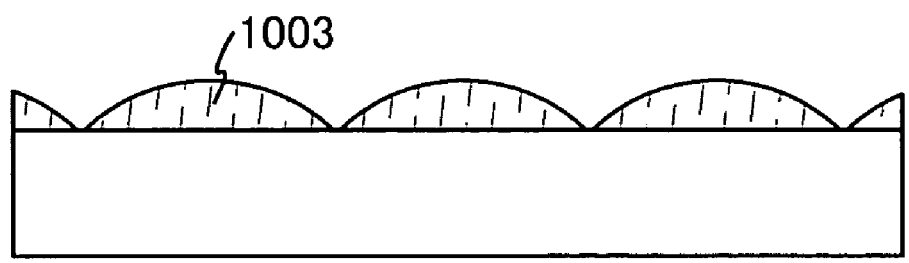

As shown in FIG. 9B, the resin 1002 that is pattered into an island-like shape is melted by heating so that its edge portion has a curved surface. Resin 1003 having a curved surface, which is formed by melting the resin 1002, is shown.

Figure 9C:
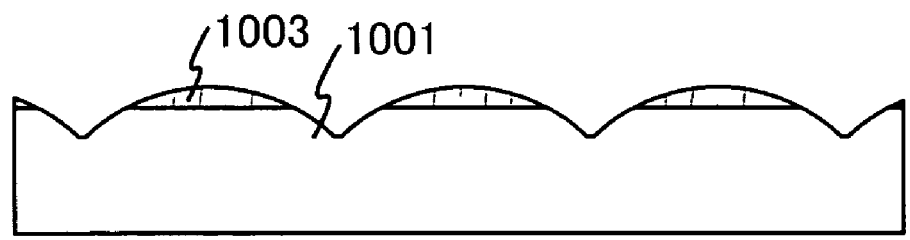
Figure 9D:
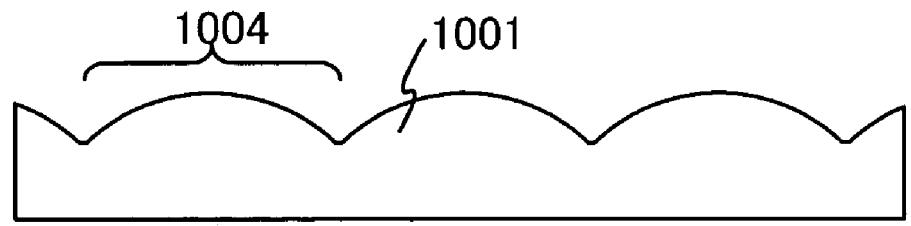

As shown in FIG. 9C, the substrate 1001 is dry-etched by using the resin 1003 as a mask. The dry-etching is carried out by using an etching gas selected appropriately depending on the material of the substrate 1001. For example, a fluorine gas or a chlorine gas such as $CF_4$, $CHF_3$, $Cl_2$, or the like can be used as the etching gas when the substrate 1001 is made of glass. By the dry-etching, the resin 1003 is etched together as shown in FIG. 9C. Lastly, a convex portion 1004 can be formed in the substrate 1001 depending on the shape of the resin 1003 with a curved surface as shown in FIG. 9D.

Figure 9E:
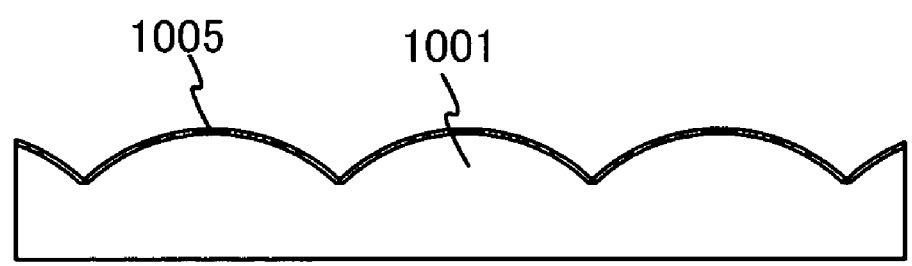

As shown in FIG. 9E, a reflective film 1005 that can reflects laser light is formed over the convex portion 1004 of the substrate 1001. Then, when the mode shown in FIG. 9E is obtained, a light emitting element is formed over the reflective film 1005.

The reflective film 1005 serving as a reflector is formed in Embodiment 5. However, an electrode of a light emitting element to be formed later may be used as a reflector or the substrate 1001 itself may be used as a reflector.

This embodiment can be combined appropriately with Embodiments 1 to 4.

[Embodiment 6]

One mode of an electronic device including a laser oscillator according to the present invention is explained in Embodiment 6.

Figure 11A:
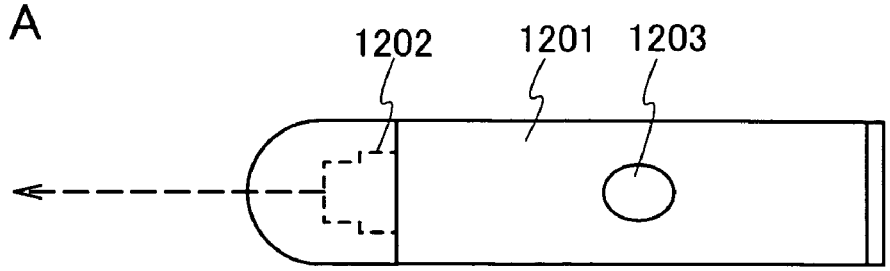
FIGS. 11A to 11C each show a structure of a laser pointer employing a laser oscillator according to one aspect of the present invention.

FIG. 11A is an external view of a laser pointer including a laser oscillator of the present invention. Reference numeral 1201 denotes a main body of the laser pointer, and reference numeral 1202 denotes a package provided with the laser oscillator therein. Internal of the main body 1201 is provided with a battery or the like for supplying electric power to the package 1202 having the laser oscillator. Reference numeral 1203 denotes a switch for controlling the application of power.

Figure 11B:
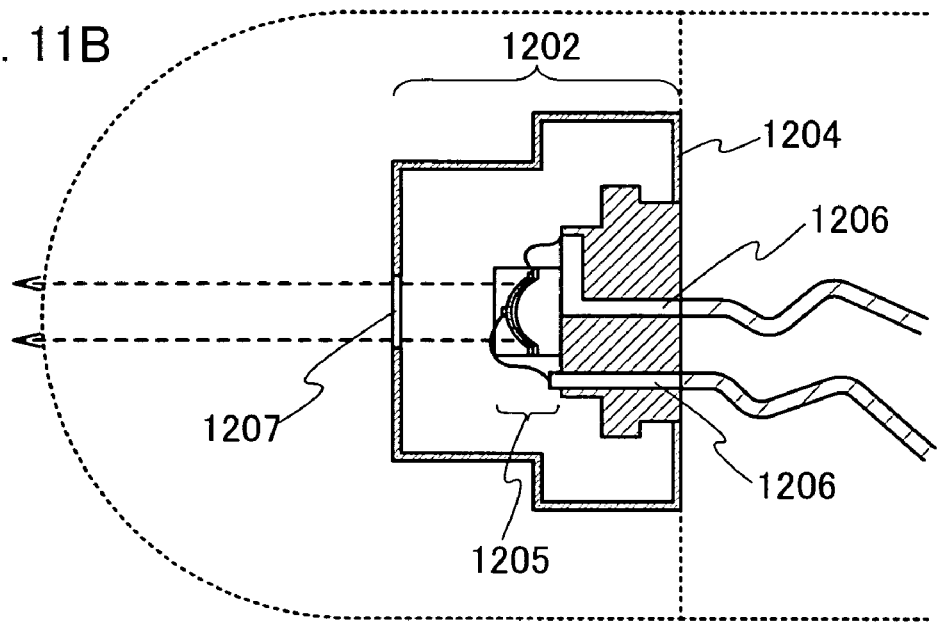

FIG. 11B is an enlarged view of the package 1202. A laser oscillator 1205 is provided in a housing 1204 to shield unnecessary radiation of laser light, in the package 1202. A part of the housing 1204 is provided with a light-transmitting window 1207 to emit laser light from the laser oscillator 1205. The laser oscillator 1205 can be supplied with current from the battery installed inside the main body 1201 via a lead 1206.

Figure 11C:
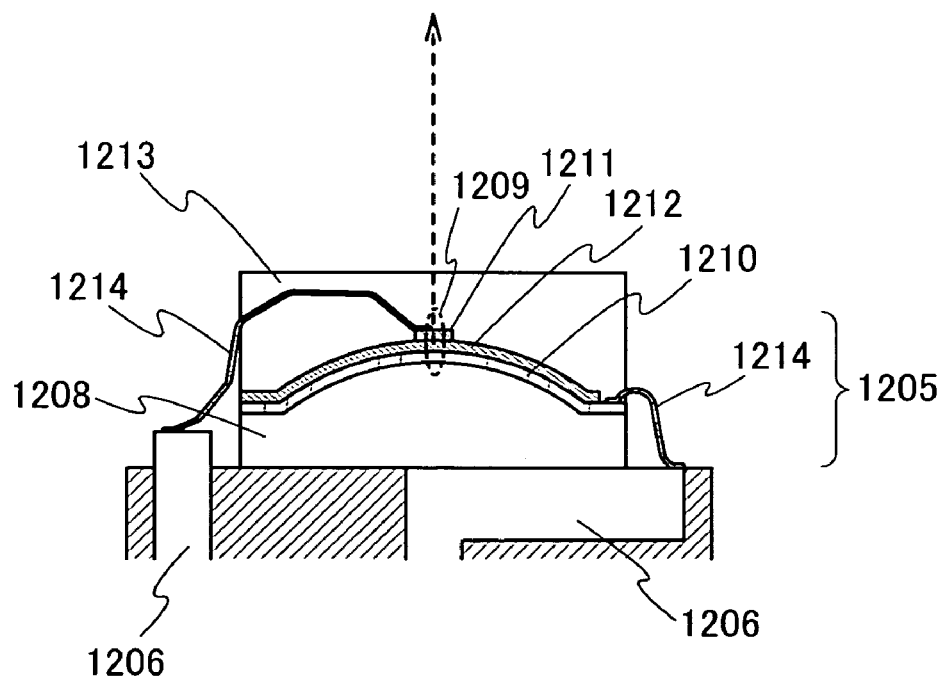

FIG. 11C is an enlarged view of the laser oscillator 1205. The laser oscillator 1205 includes a substrate 1208 having a convex portion and a light emitting element 1209 formed to overlap the convex portion. The light emitting element 1209 includes two electrodes 1210 and 1211, and an electroluminescent layer 1212 interposed between the two electrodes 1210 and 1211. The two electrodes 1210 and 1211 are electrically connected to a lead 1206 by a wire 1214. Reference numeral 1213 corresponds to resin for sealing the electroluminescent layer 1212. The resin can prevent the electroluminescent layer 1212 from being deteriorated due to moisture, oxygen, or the like.

Light is generated when current is supplied to the electroluminescent layer 1212 by applying a forward bias voltage to the electrodes 1210 and 1211 via the lead 1206. Then, the light generated in the electroluminescent layer 1212 is oscillated between the electrodes 1210 and 1211, and then, the laser light is emitted from the electrode 1210 side. An optical resonator formed from the electrodes 1210 and 1211 is an unstable resonator, thereby obtaining a single mode laser light. A part of the substrate 1208 serves as an optical system, and thus, resistance to a physical impact of electronic devices can be enhanced, which is different from the case of providing an optical system separately.

This embodiment can be combined appropriately with Embodiments 1 to 5.

[Embodiment 7]

A structure of a light emitting element used for a laser oscillator of the present invention is explained in Embodiment 7.

Figure 12:
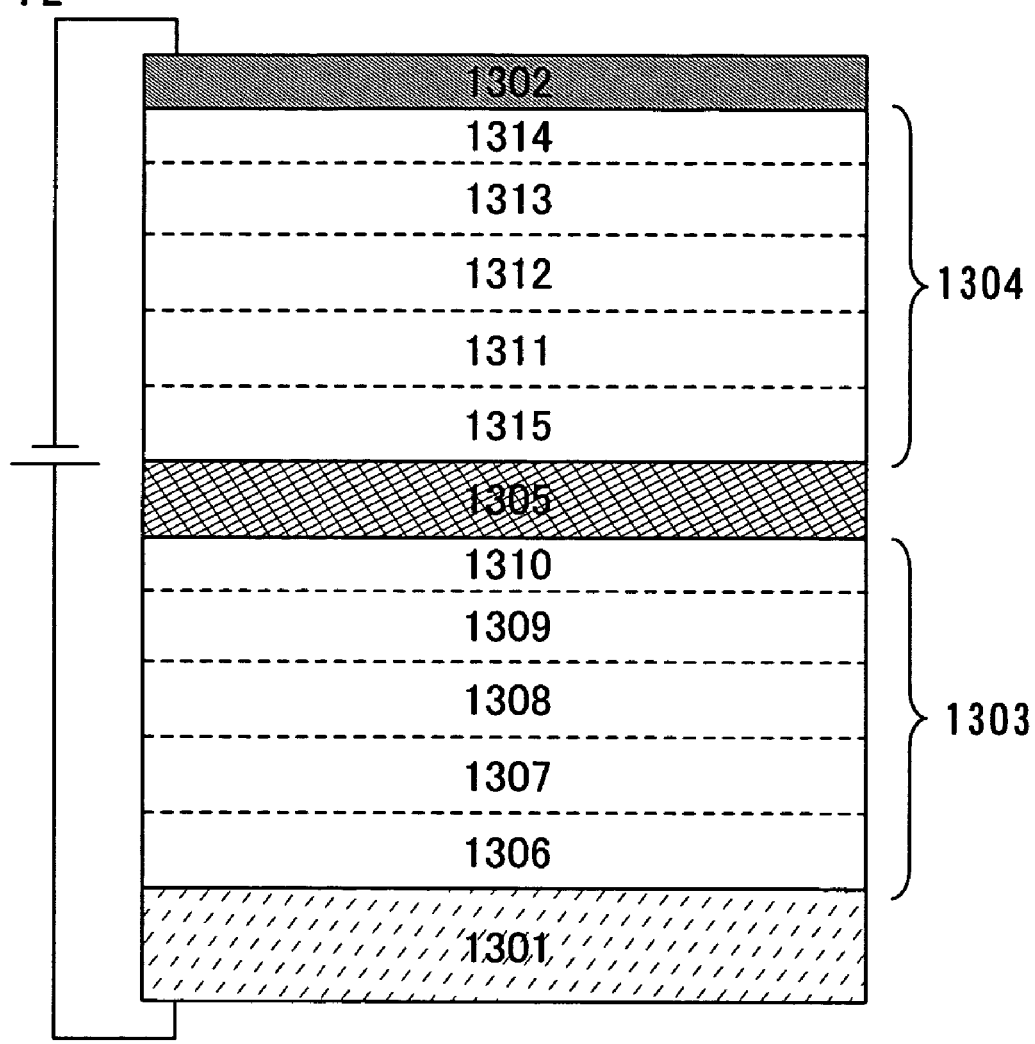
FIG. 12 shows a structure of a light emitting element included in a laser oscillator according to one aspect of the present invention.

FIG. 12 shows one mode of a structure of a light emitting element used in the present invention. The light emitting element shown in FIG. 12 has a structure including two electroluminescent layers 1303 and 1304 interposed between an anode 1301 and a cathode 1302. Further, the light emitting element shown in FIG. 12 includes a charge generation layer 1305, which is a floating electrode that is not connected to an external circuit, between the two electroluminescent layers 1303 and 1304. The electroluminescent layer 1303 is formed by sequentially stacking a hole injecting layer 1306, a hole transporting layer 1307, a light emitting layer 1308, an electron transporting layer 1309, and an electron injecting layer 1310 over the anode 1301. Further, the electroluminescent layer 1304 is formed by sequentially stacking a hole injecting layer 1315, a hole transporting layer 1311, a light emitting layer 1312, an electron transporting layer 1313, and an electron injecting layer 1314 over the charge generation layer 1305.

The light emitting element used for the laser oscillator of the present invention may include at least a light emitting layer in each electroluminescent layer. Layers having properties other than light emission (a hole injecting layer, a hole transporting layer, an electron transporting layer, and an electron injecting layer) may be appropriately used with the light emitting layer. The materials that can be used for the layers are recited in Embodiment 1. Note that the materials that can be used in the present invention are not limited to those described in Embodiment 1.

When a forward bias voltage is applied to the anode 1301 and the cathode 1302 of the light emitting element shown in FIG. 12, an electron and a hole are injected into the electroluminescent layers 1303 and 1304, respectively. Then, the recombination of carriers is carried out in each of the electroluminescent layers 1303 and 1304 to emit light. Accordingly, in the case where the distance between the anode 1301 and the cathode 1302 is constant, energy of light emission to be obtained at the same amount of current becomes higher than in the case where a light emitting element includes only one electroluminescent layer. Therefore, emission efficiency of laser light can be improved.

The charge generation layer 1305 may be formed by a material that can transmit light. For example, an ITO, a mixture of, $V_2O_5$ and an arylamine derivative; a mixture of $MoO_3$ and an arylamine derivative; a mixture of $V_2O_5$ and F4TCNQ (tetrafluoro tetrathiafulvalene); and the like can be used.

When the anode 1301 and the cathode 1302 are used as reflectors, materials or thickness thereof are selected so that the reflectance of one of these electrodes is as high as possible and the transmittance of the other electrode is approximately 5 to 70%. In the case where a reflector is formed separately, a material that can pass light through the anode 1301 or the cathode 1302 is selected. Further, the distance between two reflectors is an integral multiple of a half of the wavelength λ to be oscillated. A lamination structure of a light emitting element is designed, so that the phase of light reflected by a reflector is identical to that of light that is newly generated.

This embodiment can be combined appropriately with Embodiments 1 to 6.

[Embodiment 8]

A structure of a laser oscillator of the present invention when a reflector a convex portion and a reflector having a flat surface are used, is explained in Embodiment 8.

Figure 13:
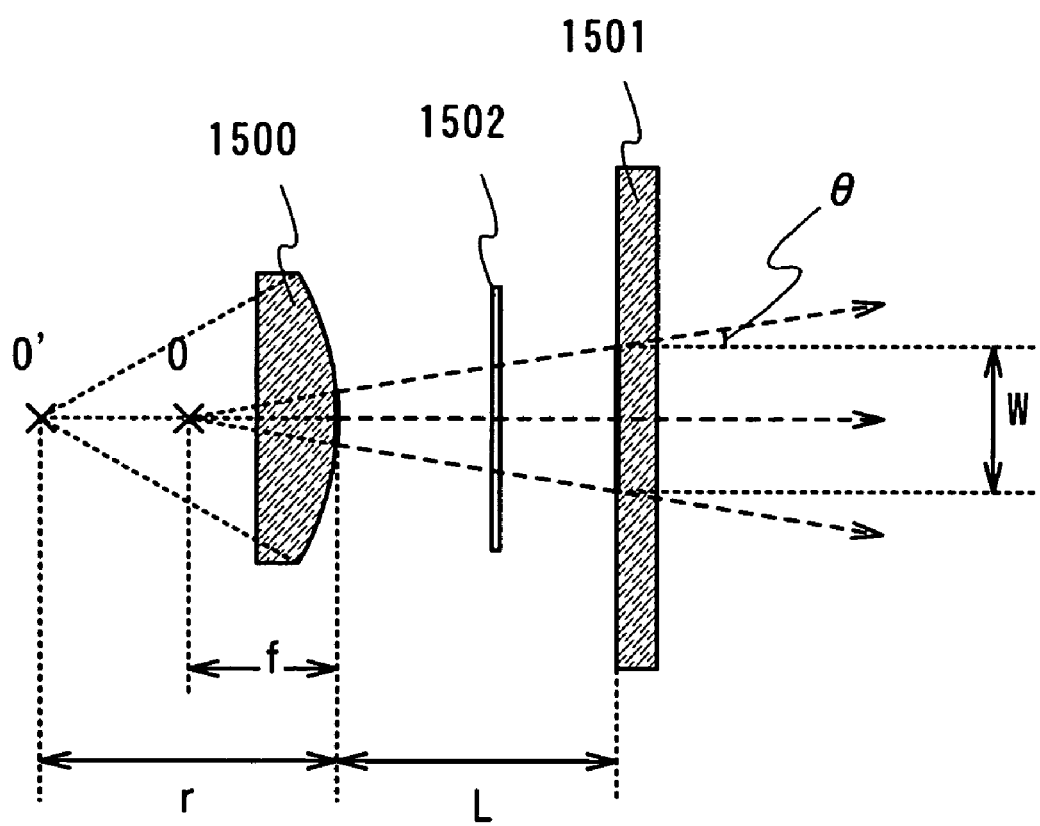
FIG. 13 shows a relation of a divergence angle θ and a length of a resonator L.

FIG. 13 shows a positional relationship of a reflector 1500 having a convex portion, a reflector 1501 having a flat surface, and a light source 1502. The light source 1502 is equivalent to a laser medium for producing stimulated emission light, specifically, is equivalent to a layer for generating light such as a light emitting layer among electroluminescent layers according to the present invention. Moreover, O shows a focal point of the convex portion of the reflector 1500, and O' shows the center of curvature of the convex portion of the reflector 1500. F denotes a focus length, r denotes a radius of curvature, and the focus length f is equivalent to a half of the radius of curvature r. The convex portion of the refractive material 1500 has the center of curvature O' on the side opposite of the reflector 1501.

It is supposed that the stimulated emission light emitted from the light source 1502 is oscillated between the reflectors 1500 and 1501 to be emitted from the reflector 1501 as laser light. When f denotes a focus length of the convex portion of the reflector 1500, θ denotes divergence angle of laser light, W denotes a beam diameter of laser light in the reflector 1501, and L denotes a length of a resonator, the relation of divergence angle θ, the focus length f, and the length of the resonator L is expressed by the next Expression 2.

$$\text{Tan}\theta = \frac{W}{2(f+L)} \qquad \text{[Expression 2]}$$

A shape of the convex portion can be optically designed to enhance directivity of laser light by the Expression 2. In addition, a laser oscillator (a light emitting device) according to the invention may be used as a display device. The display device equipped with the laser oscillator includes a projector, LCD (Liquid Crystal Display), using the laser oscillator as a backlight, and the like. Specifically, in the case of FS-LCD (Field Sequential LCD), Light emitting elements shown in embodiment 2 of each of R, G, and B may be used. As an example of the FS-LCD, the entire disclosure of US Patent 2003/0058210 is incorporated herein by reference.

This application is based on Japanese Patent Application serial no. 2003-335747 filed in Japan Patent Office on Sep. 26, 2003, the contents of which are hereby incorporated by reference.

What is claimed is:

1. A light emitting device comprising:
   a first electrode;
   an electroluminescent layer; and
   a second electrode,
   wherein the first electrode has a convex portion to the electroluminescent layer and has a first curved surface in the convex portion,
   wherein the second electrode has a concave portion to the electroluminescent layer and has a second curved surface in the concave portion,
   wherein the electroluminescent layer formed over the first electrode to overlap the convex portion,
   wherein the second electrode formed over the electroluminescent layer to overlap the convex portion,
   wherein a center of a curvature of the first curved surface is located on an opposite side of the second electrode,
   wherein a center of a curvature of the second curved surface is located on a side of the first electrode,
   wherein laser light is emitted by reflecting light generated in the electroluminescent layer between the first electrode and the second electrode,
   wherein a distance L between the first electrode and the second electrode on an extension of an optical path of the laser light satisfy following relation $r_1<0$ and $0<r_2<L$ where a radius of the curvature of the first curved surface is $r_1$ and a radius of the curvature of the second curved surface is $r_2$.

2. The light emitting device according to claim 1, wherein at least one of the first electrode and the second electrode is a reflector.

3. The light emitting device according to claim 1, wherein a reflector is provided adjacent to at least one of the first electrode and the second electrode.

4. A laser pointer having the light emitting device according to claim 1.

5. An LCD having the light emitting device according to claim 1.

6. A projector having a light emitting device according to claim 1.

7. A light emitting device comprising:
a first electrode;
an electroluminescent layer; and
a second electrode,
wherein the first electrode has a convex portion to the electroluminescent layer and has a first curved surface in the convex portion,
wherein the second electrode has a concave portion to the electroluminescent layer and has a second curved surface in the concave portion,
wherein the electroluminescent layer formed over the first electrode to overlap the convex portion,
wherein the second electrode formed over the electroluminescent layer to overlap the convex portion,
wherein a center of a curvature of the first curved surface is located on an opposite side of the second electrode,
wherein a center of a curvature of the second curved surface is located on a side of the first electrode,
wherein laser light is emitted by reflecting light generated in the electroluminescent layer between the first electrode and the second electrode,
wherein a distance L between the first electrode and the second electrode on an extension of an optical path of the laser light satisfy following relation $r_1>0$ and $r_2<L+|r_1|$ where a radius of the curvature of the first curved surface is $r_1$ and a radius of the curvature of the second curved surface is $r_2$.

8. The light emitting device according to claim 7, wherein at least one of the first electrode and the second electrode is a reflector.

9. The light emitting device according to claim 7, wherein a reflector is provided adjacent to at least one of the first electrode and the second electrode.

10. A laser pointer having the light emitting device according to claim 7.

11. An LCD having the light emitting device according to claim 7.

12. A projector having the light emitting device according to claim 7.

13. A light emitting device comprising:
a first electrode;
an electroluminescent layer; and
a second electrode,
wherein the first electrode has a concave portion to the electroluminescent layer and has a first curved surface in the concave portion;
wherein the second electrode has a convex portion to the electroluminescent layer and has a second curved surface in the convex portion,
wherein the electroluminescent layer formed over the first electrode to overlap the concave portion,
wherein the second electrode formed over the electroluminescent layer to overlap the concave portion,
wherein a center of a curvature of the first curved surface is located on a side of the second electrode,
wherein a center of a curvature of the second curved surface is located on an opposite side of the first electrode;
wherein laser light is emitted by reflecting light generated in the electroluminescent layer between the first electrode and the second electrode,
wherein a distance L between the first electrode and the second electrode on an extension of an optical path of the laser light satisfy following relation $0<r_1<L$ and $r_2<0$ where a radius of the curvature of the first curved surface is $r_1$, and a radius of the curvature of the second curved surface is $r_2$.

14. The light emitting device according to claim 13, wherein at least one of the first electrode and the second electrode is a reflector.

15. The light emitting device according to claim 13, wherein a reflector is provided adjacent to at least one of the first electrode and the second electrode.

16. A laser pointer having the light emitting device according to claim 13.

17. An LCD having the light emitting device according to claim 13.

18. A projector having the light emitting device according to claim 13.

19. A light emitting device comprising:
a first electrode;
an electroluminescent layer; and
a second electrode,
wherein the first electrode has a concave portion the electroluminescent layer and has a first curved surface in the concave portion,
wherein the second electrode has a convex portion to the electroluminescent layer and has a second curved surface in the convex portion,
wherein the electroluminescent layer formed over the first electrode to overlap the concave portion,
wherein the second electrode formed over the electroluminescent layer to overlap the concave portion,
wherein a center of a curvature of the first curved surface is located on a side of the second electrode,
wherein a center of a curvature of the second curved surface is located on an opposite side of the first electrode,
wherein laser light is emitted by reflecting light generated in the electroluminescent layer between the first electrode and the second electrode wherein a distance L between the first electrode and the second electrode on an extension of an optical path of the laser light satisfy following relation $r_1>L+|r_2|$ and $r_2<0$ where a radius of the curvature of the first curved surface is r1 and a radius of the curvature of the second curved surface is $r_2$.

20. The light emitting device according to claim 19, wherein at least one of the first electrode and the second electrode is a reflector.

21. The light emitting device according to claim 19, wherein a reflector is provided adjacent to at least one of the first electrode and the second electrode.

22. A laser pointer having the light emitting device according to claim 19.

23. An LCD having the light emitting device according to claim 19.

24. A projector having the light emitting device according to claim 19.

25. A light emitting device comprising:
a first electrode;
an electroluminescent layer; and
a second electrode,
wherein the first electrode has a first convex portion to the electroluminescent layer and has a first curved surface in the first convex portion,
wherein the second electrode has a second convex portion to the electroluminescent layer and has a second curved surface in the second convex portion,
wherein the electroluminescent layer formed over the first electrode so as to overlap the first convex portion, wherein the second electrode formed over the electroluminescent layer so as to overlap the first convex portion, wherein a center of a curvature of the first curved surface is located on an opposite side of the second electrode, wherein a center of a curvature of the second curved surface is located on an opposite side of the first electrode, wherein laser light is emitted by reflecting light generated in the electroluminescent layer between the first electrode and the second electrode, and wherein a radius of the curvature of the first curved surface $r_1$ is negative, and a radius of the curvature of the second curved surface $r_2$ is negative.

26. The light emitting device according to claim 25, wherein at least one of the first electrode and the second electrode is a reflector.

27. The light emitting device according to claim 25, wherein a reflector is provided adjacent to at least one of the first electrode and the second electrode.

28. A laser pointer having the light emitting device according to claim 25.

29. An LCD having the light emitting device according to claim 25.

30. A projector having the light emitting device according to claim 25.

31. A light emitting device comprising:
a first electrode;
an electroluminescent layer; and
a second electrode,
wherein the first electrode has a first concave portion to the electroluminescent layer and has a first curved surface in the first concave portion,
wherein the second electrode has a second concave portion to the electroluminescent layer and has a second curved surface in the second concave portion,
wherein the electroluminescent layer formed over the first electrode to overlap the first concave portion,
wherein the second electrode formed over the electroluminescent layer to overlap the first concave portion,
wherein a center of a curvature of the first curved surface is located on a side of the second electrode,
wherein a center of a curvature of the second curved surface is located on a side of the first electrode,
wherein laser light is emitted by reflecting light generated in the electroluminescent layer between the first electrode and the second electrode,
wherein a distance L between the first electrode and the second electrode on an extension of an optical path of the laser light satisfy following relation $0<r_1<L$ and $r_2>L$ where a radius of the curvature of the first curved surface is $r_1$, and a radius of the curvature of the second curved surface is $r_2$.

32. The light emitting device according to claim 31, wherein at least one of the first electrode and the second electrode is a reflector.

33. The light emitting device according to claim 31, wherein a reflector is provided adjacent to at least one of the first electrode and the second electrode.

34. A laser pointer having the light emitting device according to claim 31.

35. An LCD having the light emitting device according to claim 31.

36. A projector having the light emitting device according to claim 31.

37. A light emitting device comprising:
a first electrode;
an electroluminescent layer; and
a second electrode,
wherein the first electrode has a first concave portion to the electroluminescent layer and has a first curved surface in the first concave portion,
wherein the second electrode has a second concave portion to the electroluminescent layer and has a second curved surface in the second concave portion,
wherein the electroluminescent layer formed over the first electrode to overlap the first concave portion,
wherein the second electrode formed over the electroluminescent layer to overlap the first concave portion,
wherein a center of a curvature of the first curved surface is located on a side of the second electrode,
wherein a center of a curvature of the second curved surface is located on a side of the first electrode,
wherein laser light is emitted by reflecting light generated in the electroluminescent layer between the first electrode and the second electrode,
wherein a distance L between the first electrode and the second electrode on an extension of an optical path of the laser light satisfy following relation $0<r_1<L-r_2$ and $0<r_2<L/2$ where a radius of the curvature of the first curved surface is $r_1$ and a radius of the curvature of the second curved surface is $r_2$.

38. The light emitting device according to claim 37, wherein at least one of the first electrode and the second electrode is a reflector.

39. The light emitting device according to claim 37, wherein a reflector is provided adjacent to at least one of the first electrode and the second electrode.

40. A laser pointer having the light emitting device according to claim 37.

41. An LCD having the light emitting device according to claim 37.

42. A projector having the light emitting device according to claim 37.

43. A light emitting device comprising:
a first electrode;
an electroluminescent layer; and
a second electrode,
wherein the first electrode has a first concave portion to the electroluminescent layer and has a first curved surface in the first concave portion,
wherein the second electrode has a second concave portion to the electroluminescent layer and has a second curved surface in the second concave portion,
wherein the electroluminescent layer formed over the first electrode to overlap the first concave portion,
wherein the second electrode formed over the electroluminescent layer to overlap the first concave portion,
wherein a center of a curvature of the first curved surface is located on a side of the second electrode,
wherein a center of a curvature of the second curved surface is located on a side of the first electrode,
wherein laser light is emitted by reflecting light generated in the electroluminescent layer between the first electrode and the second electrode,
wherein a distance L between the first electrode and the second electrode on an extension of an optical path of the laser light satisfy following relation $r_1>L$ and $0<r_2<L$ where a radius of the curvature of the first curved surface is $r_1$ and a radius of the curvature of the second curved surface is $r_2$.

44. The light emitting device according to claim 43, wherein at least one of the first electrode and the second electrode is a reflector.

45. The light emitting device according to claim 43, wherein a reflector is provided adjacent to at least one of the first electrode and the second electrode.

46. A laser pointer having the light emitting device according to claim 43.

47. An LCD having the light emitting device according to claim 43.

48. A projector having the light emitting device according to claim 43.

49. A light emitting device comprising:
a first electrode;
an electroluminescent layer; and
a second electrode,
wherein the first electrode has a first concave portion to the electroluminescent layer and has a first curved surface in the first concave portion,
wherein the second electrode has a second concave portion to the electroluminescent layer and has a second curved surface in the second concave portion,
wherein the electroluminescent layer formed over the first electrode to overlap the first concave portion,
wherein the second electrode formed over the electroluminescent layer to overlap the first concave portion,
wherein a center of a curvature of the first curved surface is located on a side of the second electrode,
wherein a center of a curvature of the second curved surface is located on a side of the first electrode,
wherein laser light is emitted by reflecting light generated in the electroluminescent layer between the first electrode and the second electrode,
wherein a distance L between the first electrode and the second electrode on an extension of an optical path of the laser light satisfy following relation $0<r_1<L/2$ and $0<r_2<L-r_1$ where a radius of the curvature of the first curved surface is $r_1$ and a radius of the curvature of the second curved surface is $r_2$.

50. The light emitting device according to claim 49, wherein at least one of the first electrode and the second electrode is a reflector.

51. The light emitting device according to claim 49, wherein a reflector is provided adjacent to at least one of the first electrode and the second electrode.

52. A laser pointer having the light emitting device according to claim 49.

53. An LCD having the light emitting device according to claim 49.

54. A projector having the light emitting device according to claim 49.

* * * * *